United States Patent
Mazzamuto et al.

(10) Patent No.: US 12,040,201 B2
(45) Date of Patent: Jul. 16, 2024

(54) SYSTEM AND METHOD TO MINIMIZE IRRADIATION NON UNIFORMITY

(71) Applicant: LASER SYSTEMS & SOLUTIONS OF EUROPE, Gennevilliers (FR)

(72) Inventors: Fulvio Mazzamuto, Gennevilliers (FR); Sylvain Perrot, Gennevilliers (FR); Nabil Douri, Gennevilliers (FR); Guillaume Vincent Thebault, Gennevilliers (FR); Karim Mikaël Huet, Gennevilliers (FR); Martin Heintzmann, Gennevilliers (FR)

(73) Assignee: LASER SYSTEMS & SOLUTIONS OF EUROPE, Gennevilliers (FR)

( * ) Notice: Subject to any disclaimer, the term of this patent is extended or adjusted under 35 U.S.C. 154(b) by 259 days.

(21) Appl. No.: 17/475,759

(22) Filed: Sep. 15, 2021

(65) Prior Publication Data
US 2022/0093421 A1     Mar. 24, 2022

(30) Foreign Application Priority Data
Sep. 18, 2020  (EP) .................................... 20306056

(51) Int. Cl.
  *H01L 21/67*     (2006.01)
(52) U.S. Cl.
  CPC .. *H01L 21/67115* (2013.01); *H01L 21/67242* (2013.01)
(58) Field of Classification Search
  CPC ......... H01L 21/67115; H01L 21/67242; H01L 21/67248
  See application file for complete search history.

(56) References Cited

U.S. PATENT DOCUMENTS

| | | |
|---|---|---|
| 8,309,474 B1 | 11/2012 | Wang et al. |
| 2010/0187444 A1 | 7/2010 | Yang et al. |

(Continued)

FOREIGN PATENT DOCUMENTS

| | | |
|---|---|---|
| EP | 3 761 344 A1 | 1/2021 |
| WO | 02/25708 | 3/2002 |

OTHER PUBLICATIONS

Extended Search Report for EP20306056.1, dated Mar. 4, 2021, 8 pages.

(Continued)

*Primary Examiner* — Jae Lee
(74) *Attorney, Agent, or Firm* — NIXON & VANDERHYE

(57) ABSTRACT

The present invention relates to a process for irradiating a processed surface (5) of a processed substrate (1) so as to obtain a predefined temperature profile, the processed surface (5) comprising a first area (11) and a second area (13), said first area (11) having a first combination of optical properties and thermal properties, and said second area (13) having a second combination of optical properties and thermal properties, said first combination and second combination being different. A further object of the invention is a system (21) for irradiating a processed surface (5) of a processed substrate (1) so as to obtain a predefined temperature profile, the processed surface (5) comprising a first area (11) and a second area (13), said first area (11) having a first combination of optical properties and thermal properties, and said second area (13) having a second combination of optical properties and thermal properties, said first combination and second combination being different.

8 Claims, 6 Drawing Sheets

(56) References Cited

U.S. PATENT DOCUMENTS

2015/0292868 A1* 10/2015 Tsai ..................... G01B 11/14
356/612
2020/0075338 A1 3/2020 Lee et al.

OTHER PUBLICATIONS

Timans, "A short history of pattern effects in thermal processing," Materials Science Forum, vol. 573, Trans Tech Publications, 2008, pp. 355-374.
Cacho et al., "Simulation of pattern effect induced by millisecond annealing used in advanced metal oxide-semiconductor technologies," Journal of Applied Physics, vol. 108, 2010, pp. 014902-1 to 014902-9.
Lin et al., "Using genetic algorithm to optimize the dummy filling problem of the flash lamp anneal process in semiconductor manufacturing," Journal of Intelligent Manufacturing, vol. 23, 2012, pp. 775-785.
Hebb et al., "Laser spike annealing for nickel silicide formation," Advanced Semiconductor Manufacturing Conference (ASMC), 2011 22nd Annual IEEE/Semi, IEEE, 2011, 7 pages.
Morin et al. "Managing annealing pattern effects in 45nm low power CMOS technology," Solid-State Electronics 54.9, 2010, 4 pages.
Timans et al., "Differential thermal energy control for pattern effect suppression in rapid thermal annealing," Junction Technology (IWJT), 2014 International Workshop, IEEE, 2014, 6 pages.

* cited by examiner

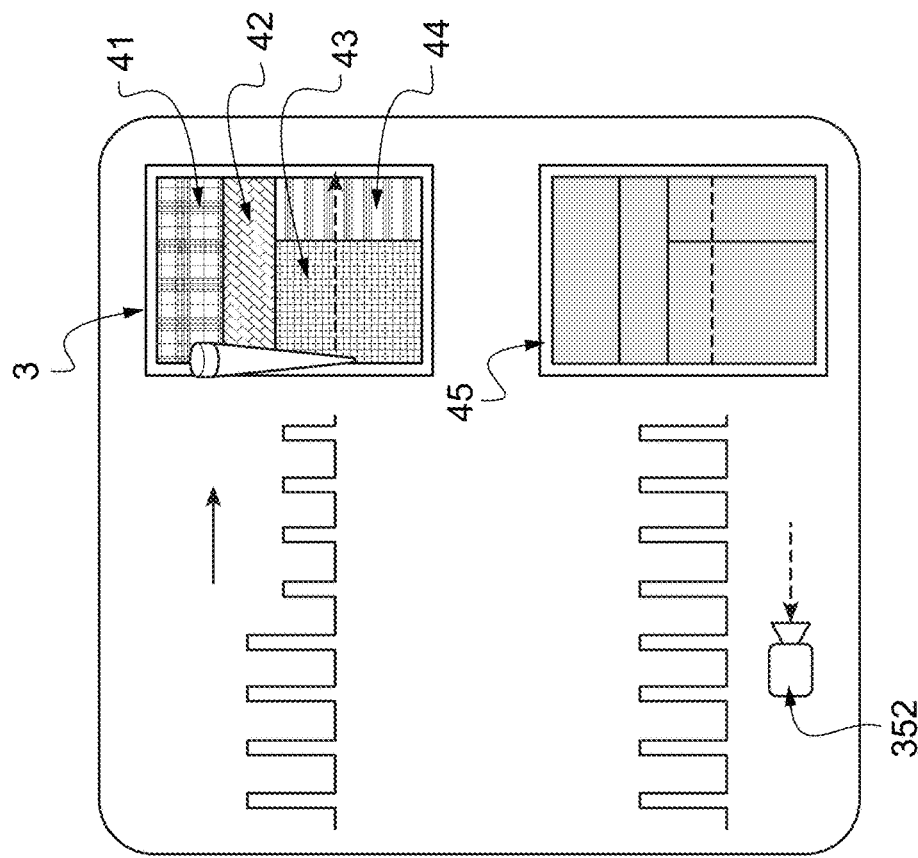
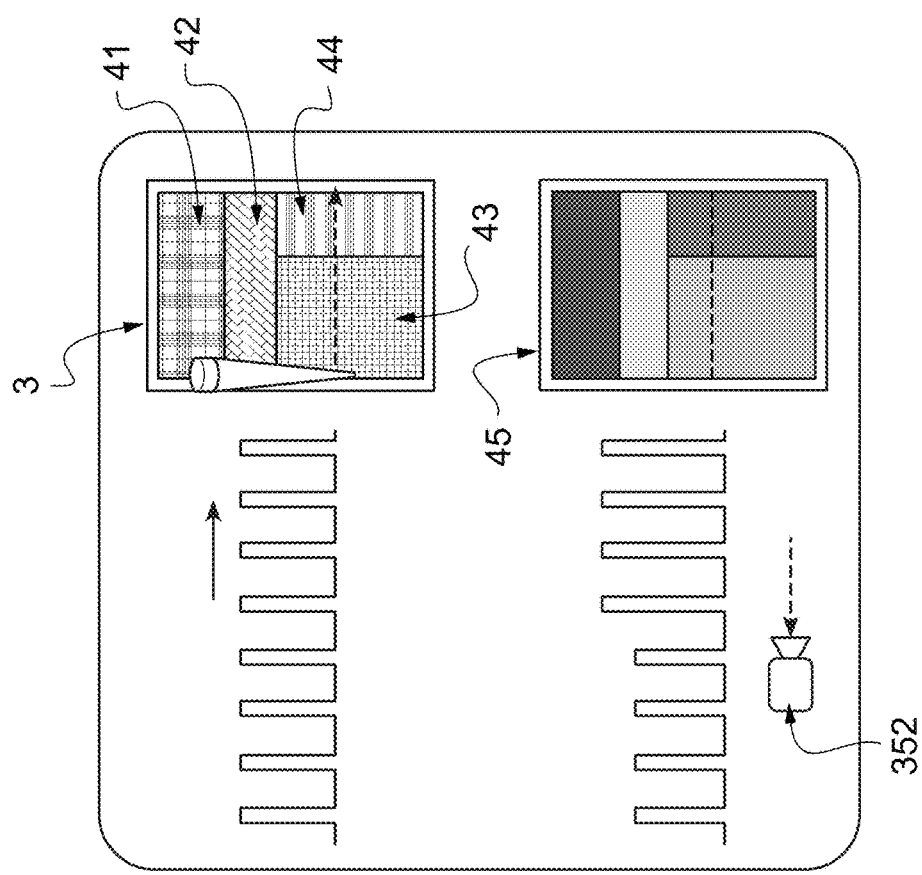
Fig.5

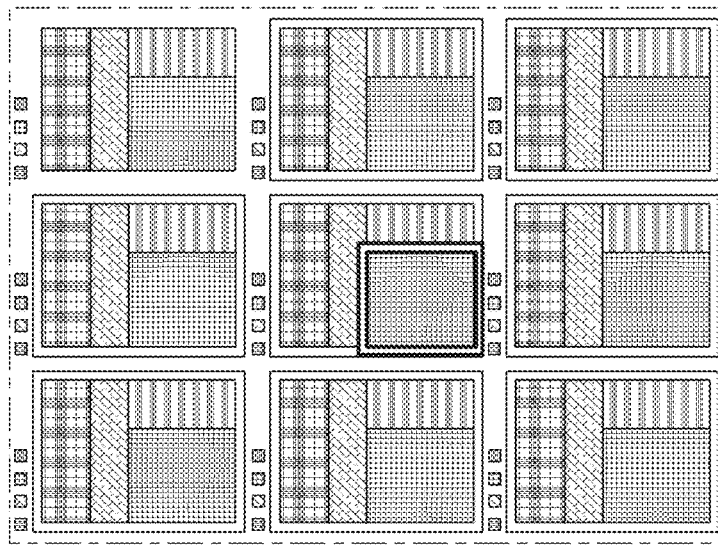
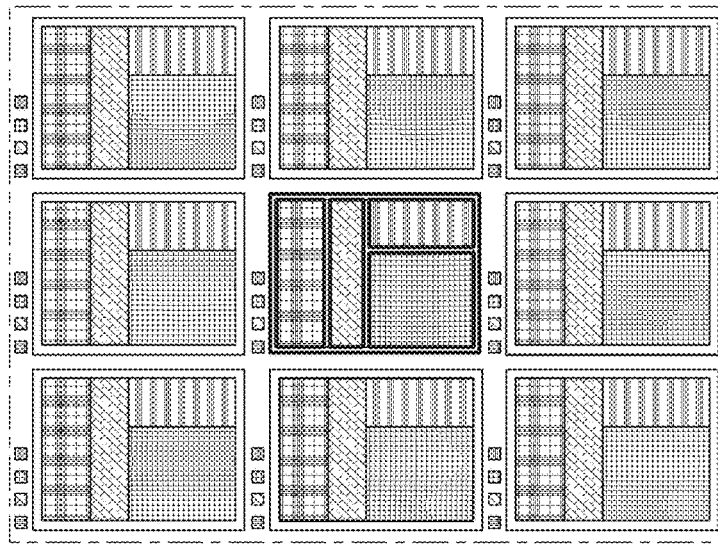
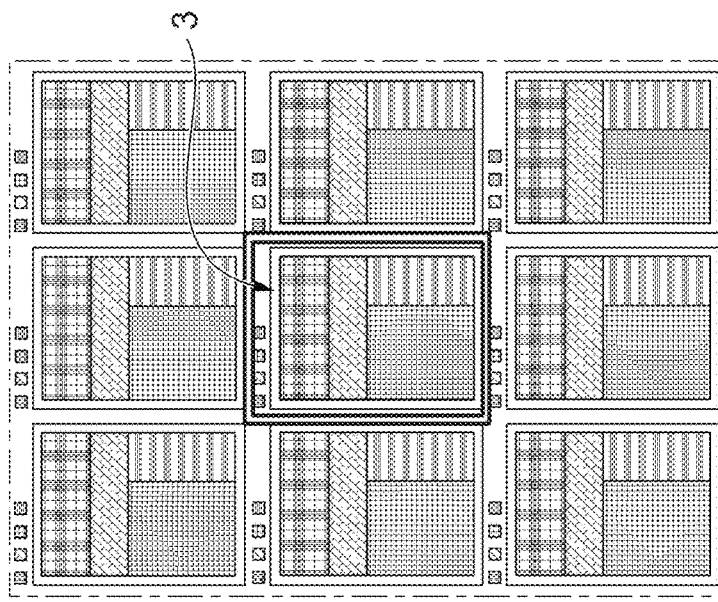
Fig.6

SYSTEM AND METHOD TO MINIMIZE IRRADIATION NON UNIFORMITY

CROSS REFERENCE TO RELATED APPLICATION

This application claims priority to EP Patent Application No. 20306056.1 filed 18 Sep. 2020, the entire contents of which is hereby incorporated by reference.

TECHNICAL FIELD OF THE INVENTION

The invention relates to a system for the thermal annealing of a substrate.

More precisely the invention relates to a system for spatially controlling an amount of energy delivered to a processed surface of a substrate illuminated by a pulsed light beam and a method for spatially controlling an amount of energy delivered to a processed surface of a substrate.

BACKGROUND INFORMATION AND PRIOR ART

To manufacture semiconductor devices, a semiconductor substrate is exposed to a pulsed light beam during a process called LASER thermal processing. During LASER thermal processing, the surface of the areas exposed to the pulsed light beam is heated to reach a given temperature for a certain amount of time. For instance, temperature can reach above 1000° C. during several nanoseconds.

The high temperature may cause the exposed areas to melt and undergo a structural change. Since the extent of the structural changes is dependent on the temperature, it is critical to control the temperature accurately. Furthermore, some areas of the substrate need to reach a higher temperature than others that are more fragile and could be damaged by a high temperature.

At this stage of the manufacturing, the surface of the substrate has already been processed and displays several patterns. As each pattern has its own optical and thermal properties, each pattern will interact differently with the pulsed light beam. For example, the coating and/or stack of the pattern, the material of the pattern, the pattern shape and/or its density may, among others, affect the amount of light absorbed by the pattern and/or its heat diffusion i.e. the rate at which heat is redistributed across the pattern and to the neighboring areas. As a consequence, the surface temperature is dependent on the pattern of the substrate itself.

As patterned semiconductor substrates usually display a variety of patterns, the resulting surface temperature is difficult to control.

Different methods have been implemented in prior art for solving the pattern effect problem.

First, dummification consists in applying some design rules when manufacturing semiconductor devices in order to reduce the differences from a pattern point of view, so that every pattern appears equivalent during LASER annealing (Lin, S. C., S. F. Liu, and F. L. Chen. *Journal of Intelligent Manufacturing* 23.3 (2012): 775-785).

Dummification can nevertheless be extremely complex and, in most cases, impossible without reducing active device density. It can induce important constraints in the design and impose trade-offs regarding performances and loading.

A second solution consists in using scanning LASER and actively adjusting the LASER energy density during scan to maintain the temperature uniform while different patterns are exposed. Temperature non uniformity is measured by a thermal emission detector (Hebb, Jeffrey, et al. *Advanced Semiconductor Manufacturing Conference* (ASMC), 2011 22nd Annual IEEE/SEMI. IEEE, 2011). This solution uses thermal emission detection to close loop, which requires the detection of a sufficient number of photons to be accurate. This approach can thus not be applied to small areas and/or fast processes. In addition, the thermal emission signal has to be captured close to the system, making the process environment more complex to design.

Third, some devices of the prior art use two light sources. A first continuous light source emits a light beam configured to heat the patterned surface to a first surface temperature below the target temperature. This first continuous light has a wavelength so long that small patterns are negligible and do not influence this heating. A second pulsed light source emits a pulsed light beam to provide the necessary energy to reach the target surface temperature. The total temperature non-uniformity observed for these two successive heating steps is lower than if the patterned surface had directly been heated to the target temperature by the second pulsed light source only. U.S. Pat. No. 8,309,474 discloses such a device.

However, the use of two light sources increases the thermal budget of the device, which should be kept low in order not to limit its application.

Finally, patent application EP19315058 discloses the use of a spatial mask able to compensate non uniformity of the pattern by modulation of LASER irradiation within the shot. Such technique can be applied only for large beams.

It would thus be desirable to develop a process allowing uniform irradiation of a processed surface of a processed substrate and that would not suffer from the disadvantages of prior art techniques. In particular, it would be advantageous to develop a process allowing irradiation of a processed surface of a processed substrate so as to obtain a predefined temperature profile, for instance uniform irradiation, and that would be simple and easy to implement, applicable to all situations such as the irradiation of a small area, the use of a narrow beam, or a fast irradiation process, and that would require only a low thermal budget.

SUMMARY OF THE INVENTION

Therefore, one object of the invention is a process for irradiating a processed surface of a processed substrate so as to obtain a predefined temperature profile, the processed surface comprising a first area and a second area, said first area having a first combination of optical properties and thermal properties, and said second area having a second combination of optical properties and thermal properties, said first combination and second combination being different, comprising the steps of:
  a) determining a reflectivity map of at least part of the processed surface representing the reflected signal for different irradiation positions, preferably for each irradiation position,
  b) providing the reflectivity map determined in step a) to a control unit in order to determine a non-uniform irradiation profile, and
  c) irradiating the processed surface of the processed substrate with the non-uniform irradiation profile determined in step b), in order to obtain a processed surface of a processed substrate irradiated so as to obtain a predefined temperature profile.

The process of the invention affords irradiation of the processed surface to obtain a predefined temperature profile, overcoming the pattern effect, is simple to implement, and requires a low thermal budget. Further, the process of the invention may be implemented even if the area to irradiate is small, if the beam is narrow, and/or if the irradiation process is a fast process.

Other advantageous and non-limiting features of the process according to the invention include:

- irradiation of the processed surface to obtain a predefined temperature profile is uniform irradiation,
- step a) comprises the sub-steps of:
  - a1) irradiating the processed surface of the processed substrate with uniform irradiation conditions,
  - a2) detecting during the irradiation step a1) the reflected signal at different irradiation positions, preferably at each irradiation position,
  - a3) determining a reflectivity map of at least part of the processed surface of the processed substrate by associating the reflected signal with the corresponding irradiation position;
- the irradiation of the processed surface with the non-uniform irradiation profile in step c) is performed with an ultra-fast control loop, with a die to die control loop, and/or with die fragmentation;
- the irradiation of the processed surface with the non-uniform irradiation profile in step c) is performed with an ultra-fast control loop, wherein implementing the ultra-fast control loop comprises the continuous recalculation of the irradiation set value depending on the comparison of the detected reflected signal and a target value;
- the irradiation of the processed surface with the non-uniform irradiation profile in step c) is performed with a die to die control loop, wherein implementing the die to die control loop comprises the recalculation of the irradiation set value after the irradiation of each die, depending on the comparison of the detected reflected signal and a target value, and wherein the irradiation set value is constant within each die;
- the irradiation of the processed surface with the non-uniform irradiation profile in step c) is performed with die fragmentation, wherein implementing the die fragmentation comprises the recalculation of the irradiation set value after the irradiation of each die, depending on the comparison of the detected reflected signal and a target value, wherein the irradiation set value is different for different areas of the die having a different response to irradiation, wherein the response to irradiation is uniform within each area, and wherein the irradiation set value is constant within each area;
- the irradiation profile determined in step b) comprises at least a first irradiation condition and a second irradiation condition, said first and second irradiation conditions having different irradiation energy densities and/or different numbers of pulses;
- the determination of the non-uniform irradiation profile in step b) is performed by the use of at least one deterministic algorithm and/or of artificial intelligence.

A further object of the invention is a system for irradiating a processed surface of a processed substrate to obtain a predefined temperature profile, the processed surface comprising a first area and a second area, said first area having a first combination of optical properties and thermal properties, and said second area having a second combination of optical properties and thermal properties, said first combination and second combination being different, said system comprising:

- a light source configured to emit a pulsed light beam towards the processed surface, wherein the light source is coupled to an optical system suitable for modulating its fluence,
- a moving stage able to move step-by-step from frame to frame of the processed surface,
- a positioning system able to identify the substrate position with respect to the exposure position,
- a scanning system able to uniformly scan a micro-spot on a large surface, said large surface being preferably a frame,
- a feedback irradiation collecting system, and
- a control unit.

Other advantageous and non-limiting features of the system according to the invention include:

- irradiation of the processed surface to obtain a predefined temperature profile is uniform irradiation;
- the scanning system is a two-mirror galvanometer or a polygon scanning-system;
- the area of the micro-spot is comprised between 0.75 square micrometers and 40 000 square micrometers, preferably between 0.75 square micrometers and 2000 square micrometers;
- the area of the large surface is at least 26×33 mm$^2$;
- the optical system coupled to the irradiation source is an optical modulator suitable for modulating the transmission of the system;
- the feedback irradiation collecting system comprises an optical system comprising at least one component able to split the irradiation source signal from the irradiation feedback signal and an ultra-fast detector;
- the optical system comprised in the feedback irradiation collecting system is able to perform attenuation and/or beam management of the irradiation feedback signal after it is split from the irradiation source signal.

DETAILED DESCRIPTION

The following description with reference to the accompanying drawings will make it clear what the invention consists of and how it can be achieved. The invention is not limited to the embodiments illustrated in the drawings. Accordingly, it should be understood that where features mentioned in the claims are followed by reference signs, such signs are included solely for the purpose of enhancing the intelligibility of the claims and are in no way limiting on the scope of the claims.

In the accompanying drawings:

FIG. 5 represents the implementation of the compensation of non uniformity between different areas of the surface to be irradiated by modifying irradiation conditions.

FIG. 6 represents the implementation of the irradiation of the processed surface with a non-uniform irradiation profile with die fragmentation.

In the present invention, "uniformly irradiating" a surface means that the irradiation conditions allow the whole surface to reach the same temperature. In this case, the predefined temperature profile of the surface presents a constant value over the whole surface.

The process of the invention aims at eliminating, or at least minimizing the non-uniformity in irradiation due to pattern effect for a surface of a substrate comprising areas with different optical and/or thermal properties.

Figure 1:
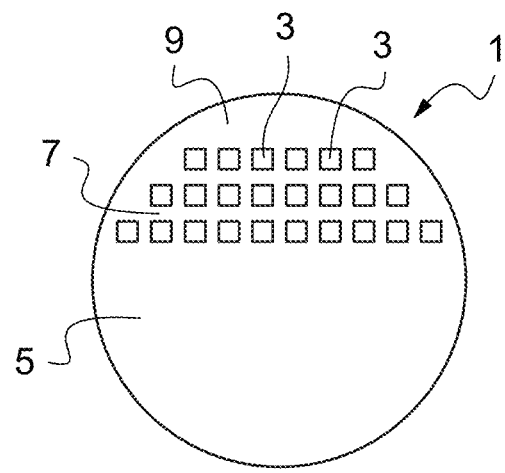
FIG. 1 is a schematic view of an example substrate.

Referring to FIG. 1, a processed substrate 1 is typically a silicon wafer or a compound wafer, such as commonly used in the semiconductor devices industries. Processed substrate 1 supports an array of dies 3 on its processed surface 5. Dies 3 are separated by scribe lines 7. Processed substrate 1 also comprises a peripheral area 9 situated on its peripheral edge. The peripheral area 9 is too small to support a functional die. The processed surface 5 may be the whole surface of the substrate 1, but it may also be only part of it, such as a group of dies present on the surface of the substrate 1, or even a single die 3 present on the surface of the substrate 1. The processed surface 5 corresponds to the surface to be uniformly irradiated.

Figure 2:
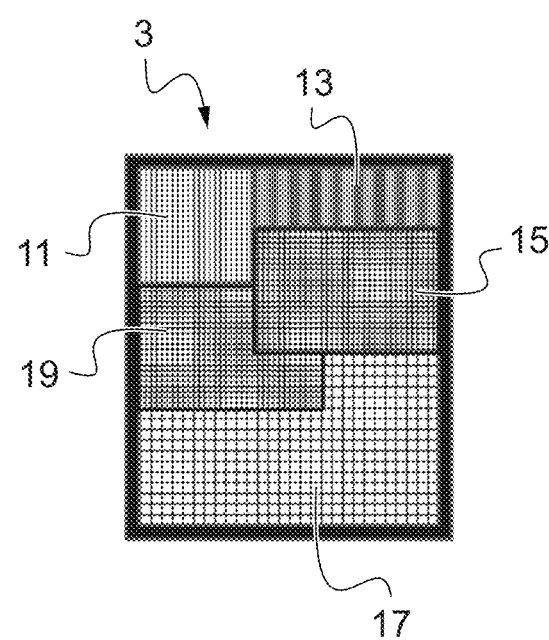
FIG. 2 is a schematic view of an example die supported by the substrate of FIG. 1.

Referring to FIG. 2, each die 3 comprises at least a first area 11 and a second area 13. First area 11 has a first combination of optical properties and thermal properties. Second area 13 has a second combination of optical properties and thermal properties. The first combination and the second combination are different.

Optical properties include light absorption by the pattern. Optical properties may be influenced by different parameters of the pattern such as the coating and/or stack of the pattern, the material of the pattern, the pattern shape and/or its density. Pattern density (also known as "pattern load") is the repetition rate of the patterns supported by the surface of areas 11, 13 of die 3.

The patterns are formed for example by the arrangement of electronic devices such as transistors, resistors and their metallic interconnects.

The reflectivity of the pattern may depend on many parameters such as the pattern density, but also the pattern pitch dimension with respect to the irradiation wavelength. For a denser pattern, the surface of the area may be for instance more reflective. In such a case, the energy delivered by a light beam is lower and the temperature reached by the surface of the area is lower.

On the contrary, for a sparser pattern, the surface of the area may be less reflective. In such a case, more energy can be delivered by the light beam, and the temperature reached by the surface of the area is higher.

Visible on FIG. 2, second area 13 has a denser pattern than first area 11.

First area 11 may correspond to a first functional circuit block of die 3. Second area 13 may correspond to a second functional circuit block of die 3.

Thermal properties include the heat diffusion rate of the area 11, 13 considered. Heat diffusion rate is the rate at which heat is redistributed within die 3. Heat diffusion rate depends for example on the materials each area 11, 13 is made of. Hence, first area 11 and second area 13 may have a different heat diffusion rate.

In general, a high heat diffusion rate results in a low surface temperature. A low heat diffusion rate results in a high surface temperature. Optical and thermal properties are interrelated as, for instance, the heat diffusion rate has an influence on the surface temperature, and the surface temperature may have an influence on the reflectivity, which is an optical property.

Each area 11, 13 has a surface area at least equal to 1 µm by 1 µm and maximum up to 26 mm by 33 mm.

The example die 3 illustrated by FIG. 2 comprises a third area 15, a fourth area 17, a fifth area 19.

Third area 15 has a third combination of optical properties and thermal properties. Fourth area 17 has a fourth combination of optical properties and thermal properties. Fifth area 19 has a fifth combination of optical properties and thermal properties. All the combinations may be different. Alternatively, some of the combinations may be similar.

All dies 3 supported by processed surface 5 of processed substrate 1 are preferably similar.

The presence of at least two areas 11, 13 within the die 3 may be due for instance to different layouts, different structures, different materials and/or different stacks within die 3.

Figure 3:
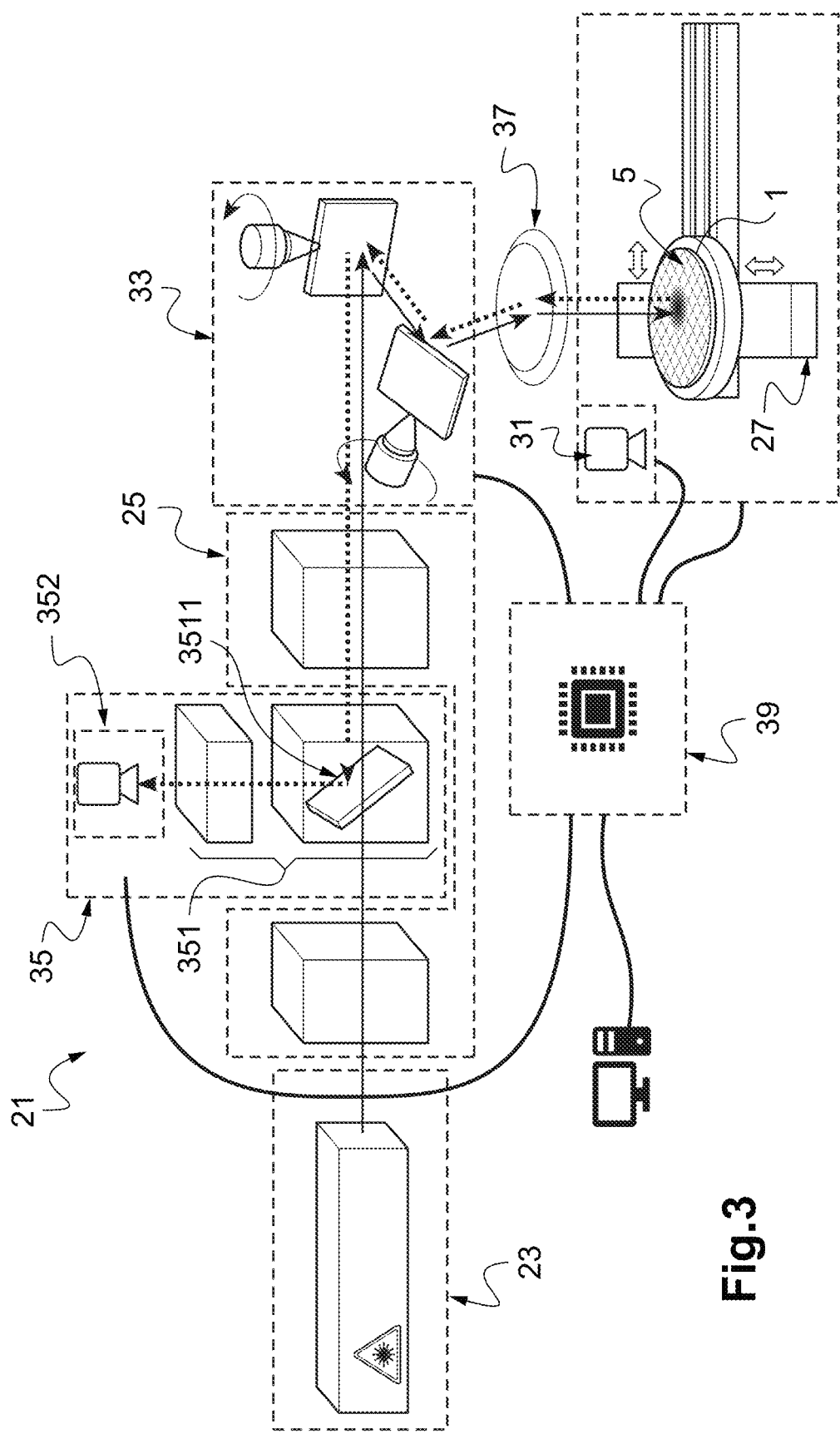
FIG. 3 represents a system for uniformly irradiating a processed surface of a processed substrate according to the invention.

FIG. 3 represents a system 21 for uniformly irradiating processed surface 5 of processed substrate 1 comprising a first area and a second area, said first area having a first combination of optical properties and thermal properties, and said second area having a second combination of optical properties and thermal properties, said first combination and second combination being different, for spatially controlling an amount of energy delivered to processed surface 5 of processed substrate 1.

The system 21 comprises a light source 23 configured to emit a pulsed light beam towards the processed surface 5 of the processed substrate 1.

Light source 23 may be an ultraviolet (UV) light source. Light source 23 comprises a LASER source. Different types of LASER sources may be used here, such as a solid state LASER, a fiber LASER or an excimer LASER light source. An excimer LASER light source can be used here for example. The wavelength of the emitted pulsed light beam is lower than 1064 nanometers (nm), even lower than 532 nanometers. Preferably, the wavelength of the emitted pulsed light beam is equal to or lower than 355 nanometers.

Light source 23 operates in pulsed mode. For example, it may produce nanosecond pulses of less than 1 to 500 nanoseconds full width at half maximum (FWHM) at a rate of 1 to more than 150 MHz.

Light source 23 is coupled to an optical system 25 suitable for modulating its fluence. Fluence corresponds to the energy delivered by the light source 23 per unit of area of the processed surface 5 of the processed substrate 1. The optical system 25 is positioned on the beam path between light source 23 and processed substrate 1. Fluence is preferably rapidly modulated by the optical system 25. The optical system 25 may be for instance an optical modulator suitable for modulating the transmission of the system. The modulation by the optical system 25 may be performed by modifying the transmission of the light beam by different physical means (and the associated physical phenomena). Different examples of physical means can be cited: sound waves that modify the optical properties of the material, electro-absorption modulation and electro-optic system in order to apply a voltage to modify the optical properties of the material or magneto-optic modulation that modifies the light propagation by applying a magnetic field on the material.

In practice, the modulation by the optical system 25 is for example performed by an acousto-optic modulator, an electro-absorption modulator, an electro-optic modulator, a magneto-optic modulator or a micro or nano electro-mechanical device (MEMS and NEMS).

A moving stage 27 is able to move in two directions in order to move step by step from a frame to another frame of the processed surface 5.

A frame is a repeatable pattern which is printed by photo-lithography on a wafer. The system 21 is preferably suitable for irradiating a processed surface 5 of a processed substrate 1 by iterative scanning of the different frames present on the processed surface 5 of the processed substrate 1. For instance, the first frame on the processed surface 5 of the processed substrate 1 is scanned by a micro-spot. Once the first frame is totally scanned, the moving stage 27 moves the processed substrate 1 in order to allow the irradiation of a further frame of the processed surface 5 of the processed substrate 1. The frame may comprise one or several dies 3 comprising at least a first area 11 and a second area 13 with different optical and/or thermal properties. Scanning of a frame of the processed surface of the processed substrate is not necessarily performed with uniform irradiation conditions within the frame, as the irradiation conditions may be modified from one die 3 to a further die, or even with the same die 3.

A positioning system 31 able to identify the substrate 1 position with respect to the exposure position is provided.

The uniform scanning of a micro-spot on the large surface is performed by a scanning system 33. Scanning system 33 is a two-mirror galvanometer. Alternatively, scanning system 33 may be any other appropriate scanning system for uniform scanning of a micro-spot on a large surface, such as a polygon-scanning system for instance.

The micro-spot uniformly scanned by the scanning system 33 may be of any appropriate size and shape. In particular, it may present an area comprised between 0.75 square micrometers and 40 000 square micrometers, preferably between 0.75 square micrometers and 2000 square micrometers. Such area values may correspond for instance to a circular spot with a diameter comprised between 1 micrometer and 50 micrometers.

The large surface may be for instance the surface of a frame. The large surface may be at least 26×33 mm².

The feedback irradiation collecting system 35 is suitable for collecting the reflected beam. The feedback irradiation collecting system 35 comprises an optical system 351, which comprises an appropriately oriented mirror in the system of FIG. 3 but may be any other optical system suitable for, among others, directing the feedback irradiation signal towards a collecting system 352. In an embodiment, the feedback collecting system 35 comprises an optical system 351 comprising at least one component 3511 able to split the irradiation source signal from the irradiation feedback signal and a collecting system 352 which is an ultra-fast detector. The optical system 351 may be able to further perform attenuation and/or beam management of the irradiation feedback signal after it is split from the irradiation source signal. If the collecting system 352 is fast enough with respect of irradiation repetition rate, the reflected signal is detected after each pulse. Alternatively, the reflected signal may be detected as a mean value over several consecutive pulses is the collecting system 352 is slower with respect of irradiation repetition rate.

An optical system 37 as a lens may be provided between the scanning system 33 and the surface 5 of the substrate 1 to be irradiated. The optical system 37 is coupled to the scanning system 33 and ensures that the irradiation beam presents the same characteristics, such as the same angle, the same focus and the same dimension over the whole large surface scanned by the micro-spot.

A control unit 39 controls the interaction of the different parts of the system 21. The control unit 39 may synchronize the different parts of the system 21.

The system 21 operates as follows: the irradiation beam interacts with the processed surface 5 of the processed substrate 1, part of it is absorbed, and part of it is reflected. Specifically, the irradiation energy density reaching the processed surface 5 of the processed substrate 1 is the sum of the absorbed irradiation and the reflected irradiation. The system 21 may be calibrated to control the energy density on the processed surface 5 of the processed substrate 1. Knowing the energy density on the processed surface 5 of the processed substrate 1, and the reflected energy measured by the feedback collecting system 35, it is possible to calculate the absorbed energy density. The reflected part of the irradiation signal can vary from few percent to over 90% and depends mainly on the patterns, stacks and/or materials of the areas within the die 3.

The feedback irradiation collecting system 35 is able to collect the reflected signal, and the positioning system 31 controls the exact irradiation and feedback position within the die 3, so that the system can associate a measured reflected energy during irradiation with an irradiated position, generating a reflectivity map 45 of the irradiated area. The reflectivity map 45 is inversely proportional to the absorbed energy and, in rough approximation, to the temperature of the areas of at least part of the irradiated processed surface 5 of a processed substrate 1. The reflectivity map 45 is a reflectivity map of at least part of the processed surface 5 of the processed substrate 1. In an embodiment, the generated reflectivity map 45 is a reflectivity map of a single die 3 of the processed surface 5 of a processed substrate 1. The reflectivity map 45 of at least part of the processed surface 5 of the processed substrate 1 may be determined by associating the reflected signal with the corresponding irradiation position (step a3). The corresponding irradiation position is preferably determined by the positioning system 31.

Figure 4:
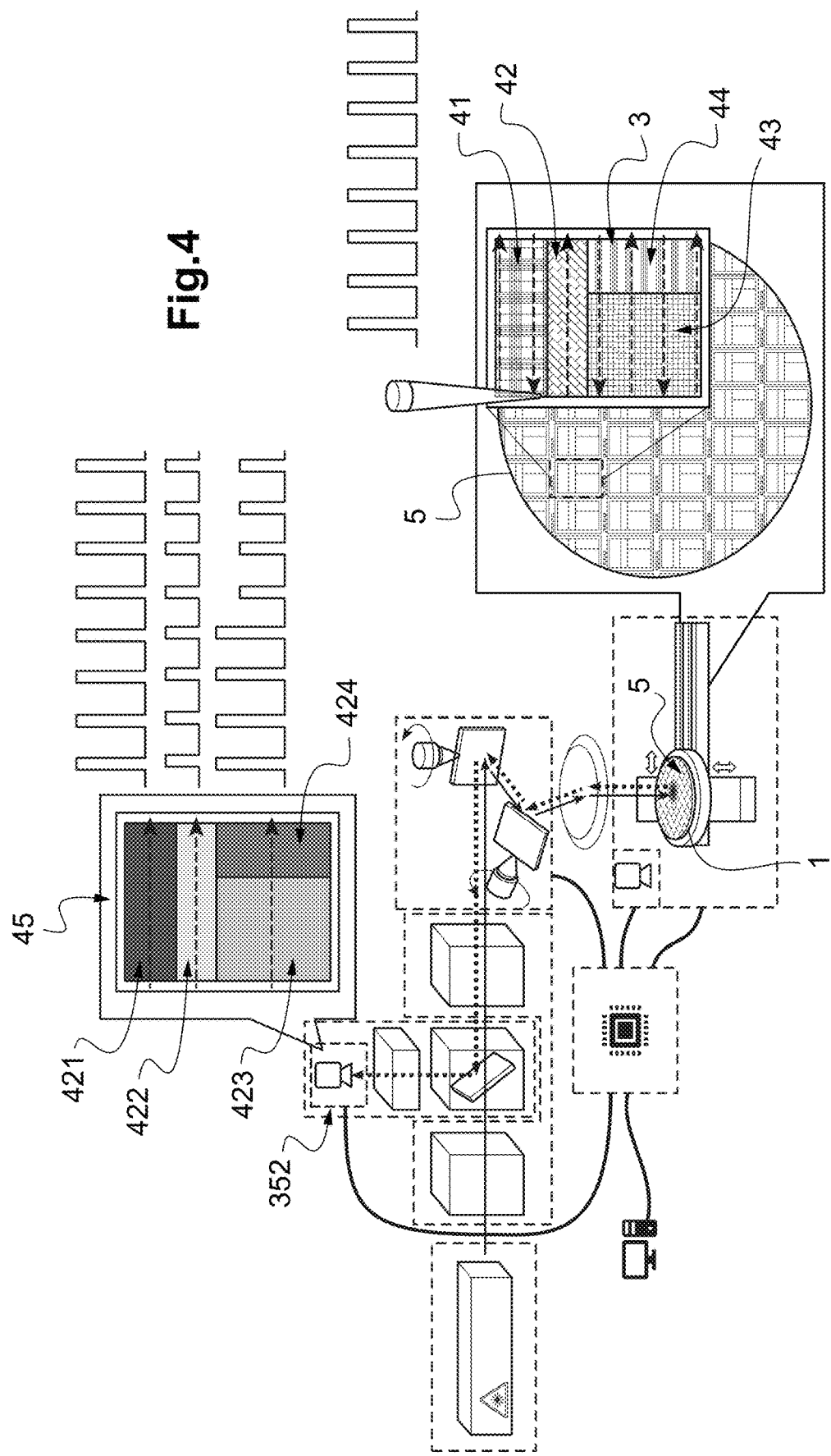
FIG. 4 represents the implementation of a process for uniformly irradiating a processed surface of a processed substrate according to the invention.

Referring to FIG. 4, the represented process corresponds to the sub-steps a1 of irradiating the processed surface 5 of the processed substrate 1 with uniform irradiation conditions, and a2 of detecting during the irradiation step a1 the reflected signal at different irradiation positions.

The scanning of the die 3 present on the surface 5 of the substrate 1 with the beam is performed along the path materialized by dotted arrows. The scanning path thus goes successively through the first area 41 of the die 3, the second area 42 of the die 3, and the third 43 and fourth 44 areas of the die 3. The scanning is uniform on a single die 3; all pulses have the same length and intensity.

The collecting system 352 collects the reflected signal at each irradiation position. The determination of the reflected signal may be performed alternatively as a mean value for several consecutive irradiation positions, for instance for from 2 to 10 consecutive irradiation positions. As can be seen on the pulses representation, the reflected signal on each area 41, 42, 43 and 44 of the die 3 may differ in terms of intensity from one area to another. The reflected signal is uniform for each area 41, 42, 43 and 44 of the die 3. A 2D-reflectivity map 45 corresponding to the scanned die is obtained, with different areas 421, 422, 423 and 424 respectively corresponding to areas 41, 42, 43 and 44 of the die 3.

Referring to FIG. 5, the left part represents the implementation of step a1, with a uniform irradiation of all areas 41, 42, 43 and 44 of the die 3, and collection of a non-uniform reflected signal by the collecting system 352 to determine a 2D-reflectivity map 45. The right part represents the implementation of step c, with irradiation of the die 3 with a non-uniform irradiation profile determined from the 2D-reflectivity map 45. The reflected signal collected by the collecting system 352 is uniform, guaranteeing that the surface irradiation was uniform in terms of energy provided to the die 3, whatever the optical and thermal properties of each area 41, 42, 43 or 44 of the die 3.

Referring to FIG. 6, the implementation of step c with die fragmentation is represented. Each area of the die 3 framed with a double-line is irradiated with uniform conditions. The left panel presents several dies, wherein the central die 3 is scanned with uniform irradiation conditions, thus providing determination of a 2D reflectivity map 45 which is input into the control unit 39. The control unit 39 then determines a non-uniform irradiation profile—step b—, which is used for irradiating the next die, presented on the central panel. The non-uniform irradiation profile is materialized on the central panel by the four different areas framed with a double-line, corresponding to four different areas of the die. The right panel details one area of the die which is irradiated with uniform irradiation conditions. Die fragmentation preferably comprises the recalculation of the irradiation set value after the irradiation of each die, depending on the comparison of the detected reflected signal and a target value. The irradiation set value is different for different areas of the die having a different response to irradiation. The response to irradiation is uniform within each area, and the irradiation set value is constant within each area.

Alternatively or in addition to die fragmentation, step c may be implemented by an ultra-fast control loop, a frame-to-frame control loop, and/or with a die-to-die control loop.

Implementing the ultra-fast control loop comprises the continuous recalculation of the irradiation set value depending on the comparison of the detected reflected signal and a target value. «Continuous recalculation» corresponds to recalculation of the irradiation set value after each LASER pulse or after a predetermined number of several LASER pulses. The predetermined number of several LASER pulses may range from 2 to several hundreds.

Implementing the die-to-die control loop comprises the recalculation of the irradiation set value after the irradiation of each die 3, depending on the comparison of the detected reflected signal and a target value. The irradiation set value is constant within each die. Every die 3 should have a comparable reflectivity map 45. Nevertheless, lithography variability or deposition variability may trigger non uniformity from die to die in a given sub-region of the die or in average. The die-to-die control loop is thus particularly useful for processed substrates 1 obtained with no or little lithography variability or deposition variability.

The reflectivity map 45 determined after irradiation of the first die 3 is provided to the control unit 39, which determines a non-uniform irradiation profile to be used for irradiating the next die. This iteration may be repeated until no variation or a low level of variation in the 2D-reflectivity map 45 is obtained. Once this stage is reached, recalculation of the non-uniform irradiation profile is no more necessary for irradiation of the further dies.

Figure 7:
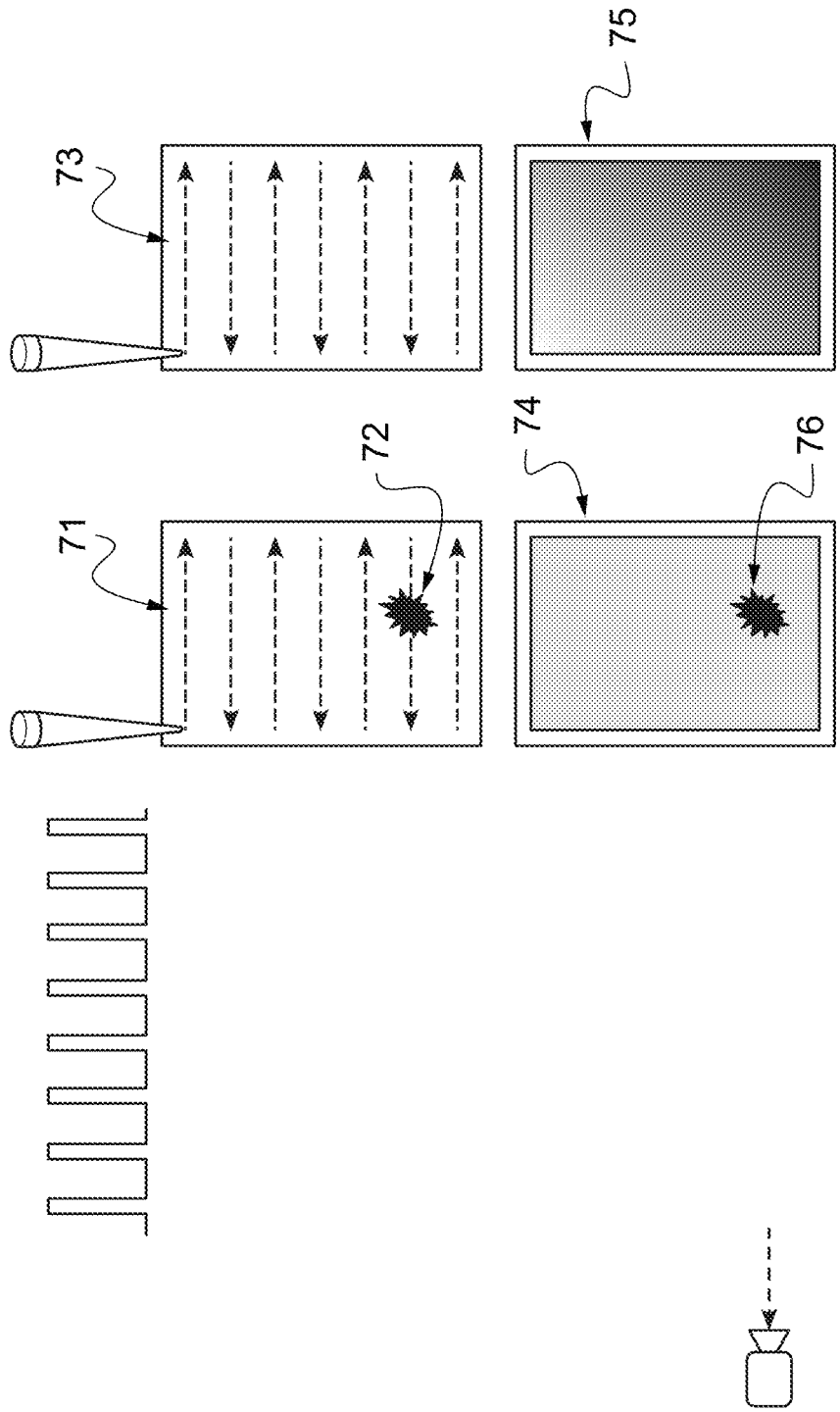
FIG. 7 represents the detection of a system malfunction, a degradation or a defect on the irradiated surface implemented in a process of the invention.

Referring to FIG. 7, a process according to the invention may also afford detecting other sources of variability such as substrate defects, particles or pattern defects, or system malfunctions or degradation. The uniform irradiation of a die 73 presenting the same optical and thermal properties on its whole area will provide a uniform 2D-reflectivity map 75. Conversely, as a source of variability 72 triggers a change in optical and/or thermal properties, uniform irradiation of a die 71 comprising a source of variability 72 will provide a non-uniform 2D-reflectivity map 74 comprising a non-uniformity 76. Further implementation of step c) of the process of the invention triggers a uniform irradiation of the whole die 71 in terms of energy provided to the die 71, despite the presence of the source of variability 72.

The detection of the other sources of variability may of course similarly be performed within dies which, in addition to the at least one source of variability, present non-uniform optical and/or thermal properties.

Accordingly, the process according to the invention may comprise, after step a), an additional step of analysis of the reflectivity map determined in step a) in order to identify the presence and/or the nature of at least one non uniformity triggered by a source of variability selected from the group consisting of substrate defects, particles or pattern defects, or system malfunctions or degradation.

Said analysis step may, in some cases, trigger a suitable action such as for instance carrying on the process despite the identified defect, stopping the process implementation and/or alerting of the presence on the identified non-uniformity for instance via an alarm signal.

The invention claimed is:

1. A process for irradiating a processed surface of a processed substrate so as to obtain a predefined temperature profile, the processed surface comprising a first area and a second area, said first area having a first combination of optical properties and thermal properties, and said second area having a second combination of optical properties and thermal properties, said first combination and second combination being different, comprising the steps of:
   a) determining a reflectivity map of at least part of the processed surface representing the reflected signal for different irradiation positions,
   b) providing the reflectivity map determined in step a) to a control unit in order to determine a non-uniform irradiation profile, and
   c) irradiating the processed surface of the processed substrate with the non-uniform irradiation profile determined in step b), in order to obtain a processed surface of a processed substrate irradiated so as to obtain a predefined temperature profile,
   wherein the irradiation of the processed surface with the non-uniform irradiation profile in step c) is performed with die fragmentation, and
   wherein implementing the die fragmentation comprises the recalculation of the irradiation set value after the irradiation of each die, depending on the comparison of the detected reflected signal and a target value, wherein the irradiation set value is different for different areas of the die having a different response to irradiation, wherein the response to irradiation is uniform within each zone, and wherein the irradiation set value is constant within each zone.

2. The process according to claim 1, wherein step a) comprises the substeps of:
   a1) irradiating the processed surface of the processed substrate with uniform irradiation conditions,
   a2) detecting during the irradiation step a1) the reflected signal at different irradiation positions,
   a3) determining a reflectivity map of at least part the processed surface of the processed substrate by associating the reflected signal with the corresponding irradiation position.

3. The process according to claim 1, wherein the irradiation of the processed surface with the non-uniform irradiation profile in step c) is performed with an ultra-fast control loop, with a die to die control loop.

4. The process according to claim 3, wherein the irradiation of the processed surface with the non-uniform irradiation profile in step c) is performed with an ultra-fast control loop.

5. The process according to claim 3, wherein the irradiation of the processed surface with the non-uniform irradiation profile in step c) is performed with a die to die control loop, wherein implementing the die to die control loop comprises the recalculation of the irradiation set value after the irradiation of each die, depending on the comparison of the detected reflected signal and a target value, and wherein the irradiation set value is constant within each die.

6. The process according to claim 1, wherein the non-uniform irradiation profile determined in step b) comprises at least a first irradiation condition and a second irradiation condition, said first and second irradiation conditions having different irradiation energy densities and/or different numbers of pulses.

7. The process according to claim 1, wherein the determination of the non-uniform irradiation profile in step b) is performed by the use of at least one deterministic algorithm and/or of artificial intelligence.

8. A process for irradiating a processed surface of a processed substrate so as to obtain a predefined temperature profile, the processed surface comprising a first area and a second area, said first area having a first combination of optical properties and thermal properties, and said second area having a second combination of optical properties and thermal properties, said first combination and second combination being different, comprising the steps of:
 a) determining a reflectivity map of at least part of the processed surface representing the reflected signal for different irradiation positions,
 b) providing the reflectivity map determined in step a) to a control unit in order to determine a non-uniform irradiation profile, and
 c) irradiating the processed surface of the processed substrate with the non-uniform irradiation profile determined in step b), in order to obtain a processed surface of a processed substrate irradiated so as to obtain a predefined temperature profile,
 wherein the irradiation of the processed surface with the non-uniform irradiation profile in step c) is performed with a die to die control loop, and
 wherein implementing the die to die control loop comprises the recalculation of the irradiation set value after the irradiation of each die, depending on the comparison of the detected reflected signal and a target value, and wherein the irradiation set value is constant within each die.

* * * * *